(12) United States Patent
Van Schuylenbergh et al.

(10) Patent No.: US 7,293,996 B2
(45) Date of Patent: Nov. 13, 2007

(54) TRANSMISSION-LINE SPRING STRUCTURE

(75) Inventors: Koenraad F. Van Schuylenbergh, Sunnyvale, CA (US); Christopher L. Chua, San Jose, CA (US); David K. Fork, Los Altos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 11/463,283

(22) Filed: Aug. 8, 2006

(65) Prior Publication Data

US 2006/0286832 A1   Dec. 21, 2006

Related U.S. Application Data

(62) Division of application No. 10/913,904, filed on Aug. 5, 2004, now abandoned.

(51) Int. Cl.
*H01R 12/00* (2006.01)
(52) U.S. Cl. ...................................................... 439/66
(58) Field of Classification Search .............. 439/66, 439/81, 117
See application file for complete search history.

(56) References Cited

U.S. PATENT DOCUMENTS

| 3,842,189 A | 10/1974 | Southgate |
| 3,952,404 A | 4/1976 | Matunami |
| 4,189,342 A | 2/1980 | Kock |
| 5,280,139 A | 1/1994 | Suppelsa et al. |
| 5,506,515 A | 4/1996 | Godshalk et al. |
| 5,613,861 A | 3/1997 | Smith et al. |
| 5,665,648 A | 9/1997 | Little |
| 5,848,685 A | 12/1998 | Smith et al. |
| 5,914,218 A | 6/1999 | Smith et al. |
| 5,944,537 A | 8/1999 | Smith et al. |
| 5,979,892 A | 11/1999 | Smith |
| 6,046,599 A | 4/2000 | Long et al. |
| 6,091,256 A | 7/2000 | Long et al. |
| 6,184,065 B1 | 2/2001 | Smith et al. |
| 6,184,699 B1 | 2/2001 | Smith et al. |

(Continued)

OTHER PUBLICATIONS

Microstrip Trace Impedance Calculator: http://www.ernclab.umr.edu/pcbtlc/microstrip.html.

(Continued)

*Primary Examiner*—Briggitte R. Hammond
(74) *Attorney, Agent, or Firm*—Bever, Hoffman & Harms, LLP; Patrick T. Bever

(57) ABSTRACT

A curved transmission-line spring structure formed by self-bending materials (e.g., stress-engineered materials, intermetallic compounds and/or bimorphs) that are layered to form a stripline or microstrip transmission line. A dielectric layer is sandwiched between two conductive layers, which form the signal and ground lines of the structure. The various layers are etched to form an elongated spring structure, and then one end of the spring structure is released from the underlying substrate, causing the tip of the released end to bend away from the substrate for contact with a second device. One or both of the conductive layers is fabricated using self-bending spring metals to facilitate the bending process, and plated metal is utilized for conductivity. Alternatively, or in addition, the dielectric layer is formed using a stress-engineered dielectric material. Two-tip and three-tip structures are used to facilitate connection of both the ground and signal lines.

16 Claims, 11 Drawing Sheets

U.S. PATENT DOCUMENTS

| | | |
|---|---|---|
| 6,194,739 B1 | 2/2001 | Ivanov et al. |
| 6,208,225 B1 | 3/2001 | Miller |
| 6,213,789 B1 | 4/2001 | Chua et al. |
| 6,218,910 B1 | 4/2001 | Miller |
| 6,252,175 B1 | 6/2001 | Khandros |
| 6,290,510 B1 | 9/2001 | Fork et al. |
| 6,528,350 B2 | 3/2003 | Fork |
| 6,534,249 B2 | 3/2003 | Fork et al. |
| 6,768,403 B2 | 7/2004 | Hsu et al. |
| 6,827,584 B2 | 12/2004 | Mathieu et al. |
| 2002/0013070 A1 | 1/2002 | Fork et al. |
| 2002/0110757 A1 | 8/2002 | Fork et al. |
| 2002/0110761 A1 | 8/2002 | Fork et al. |
| 2002/0164893 A1 | 11/2002 | Mathieu et al. |
| 2003/0010615 A1 | 1/2003 | Fork et al. |
| 2004/0102064 A1 | 5/2004 | Mathieu |

OTHER PUBLICATIONS

Impedance Calculator for Grounded Coplanar 3-Strip Structure: http://www.eecircle.com/applets/016/Gcp3.html.

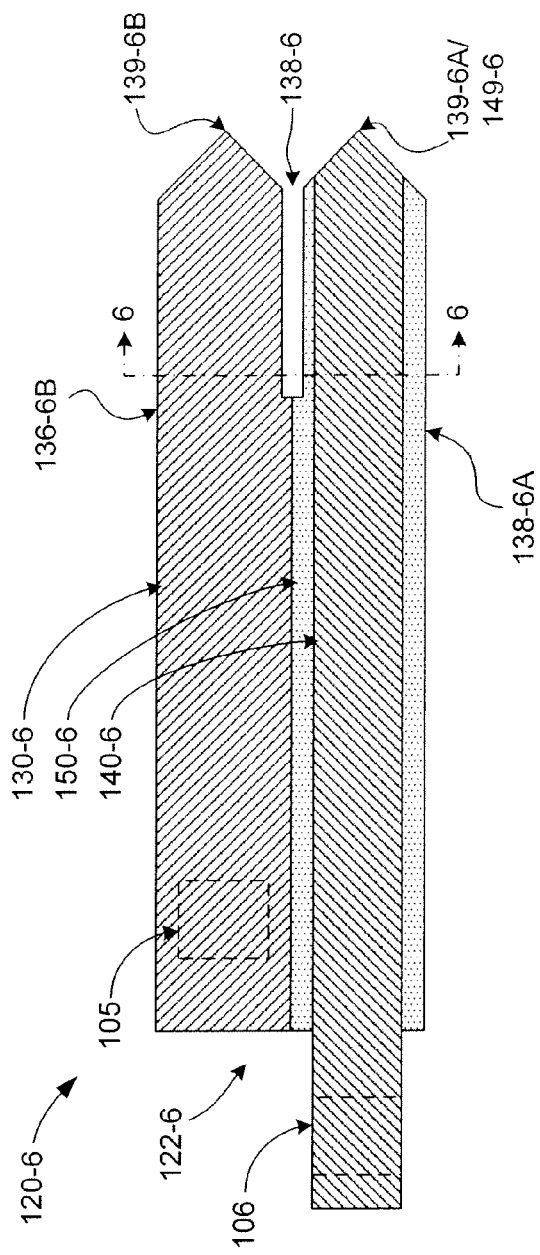
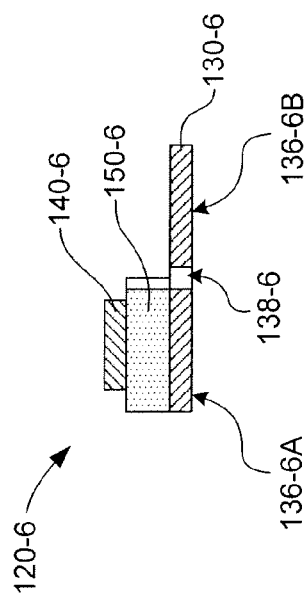
FIG. 6(A)
FIG. 6(B)

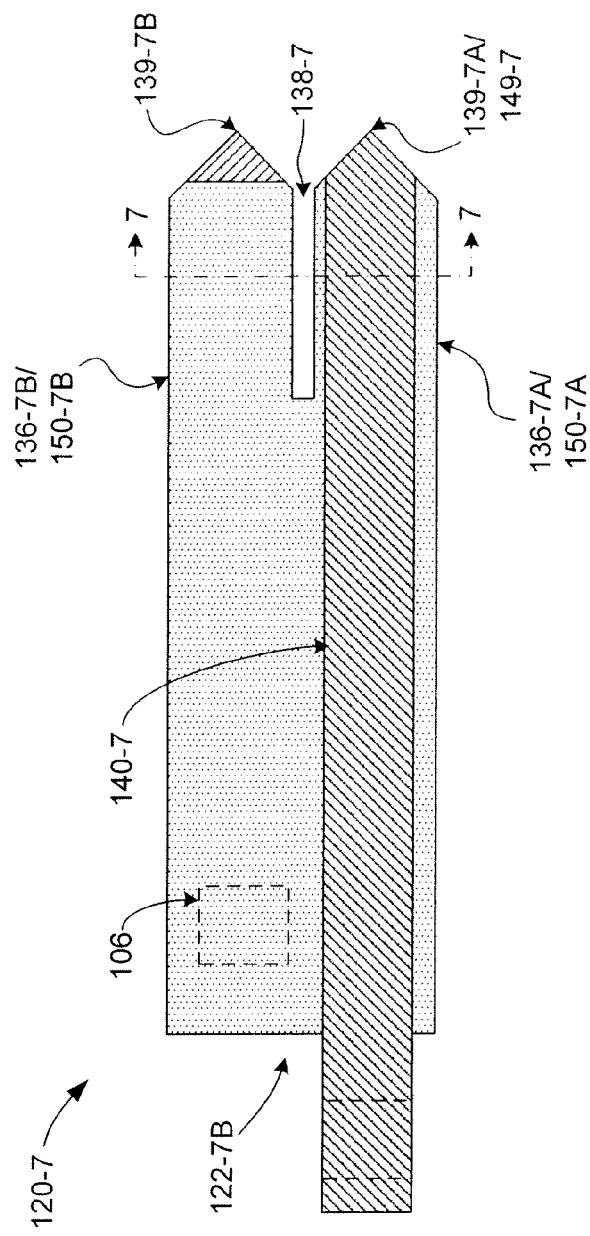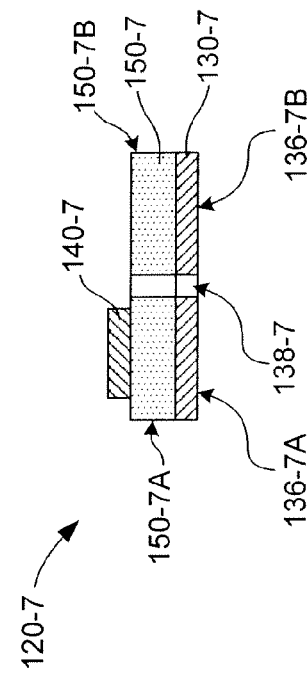
FIG. 7(A)
FIG. 7(B)

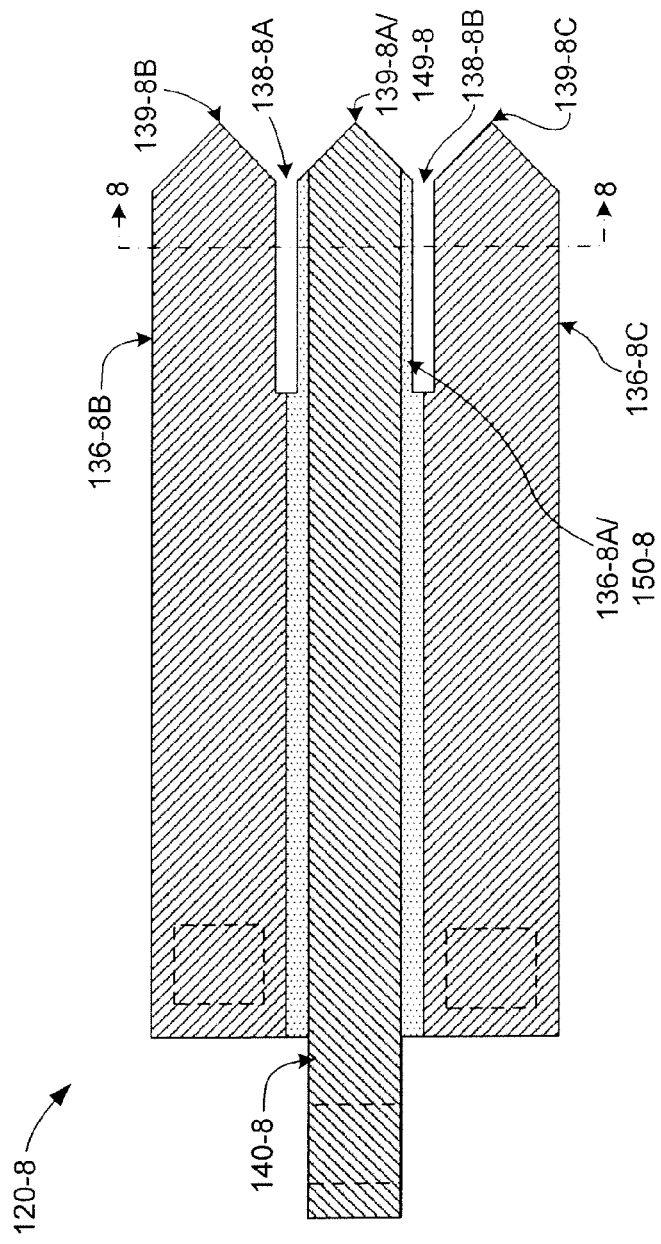
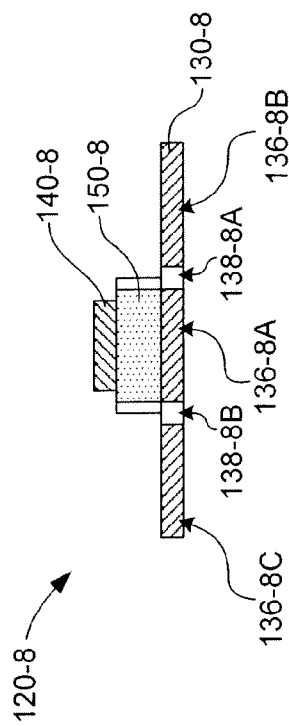
FIG. 8(A)
FIG. 8(B)

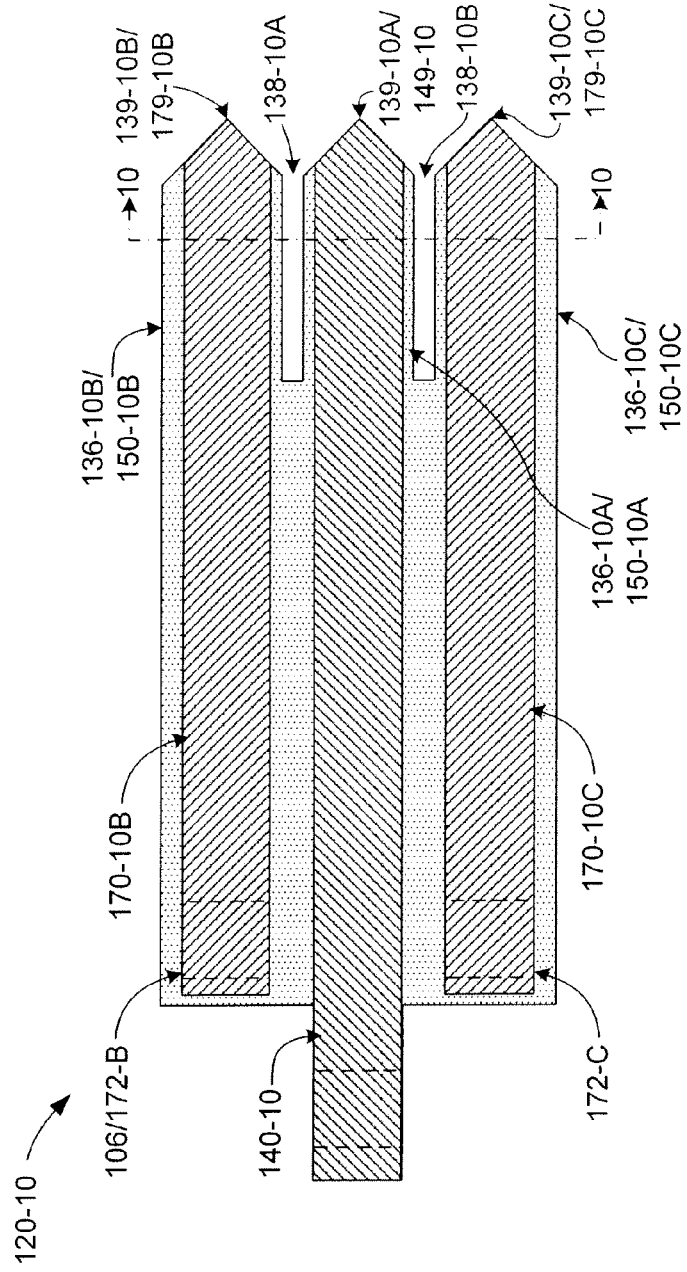
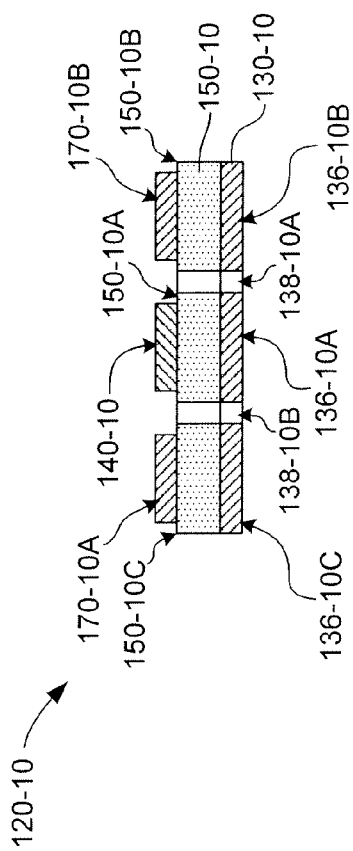
FIG. 10(A)
FIG. 10(B)

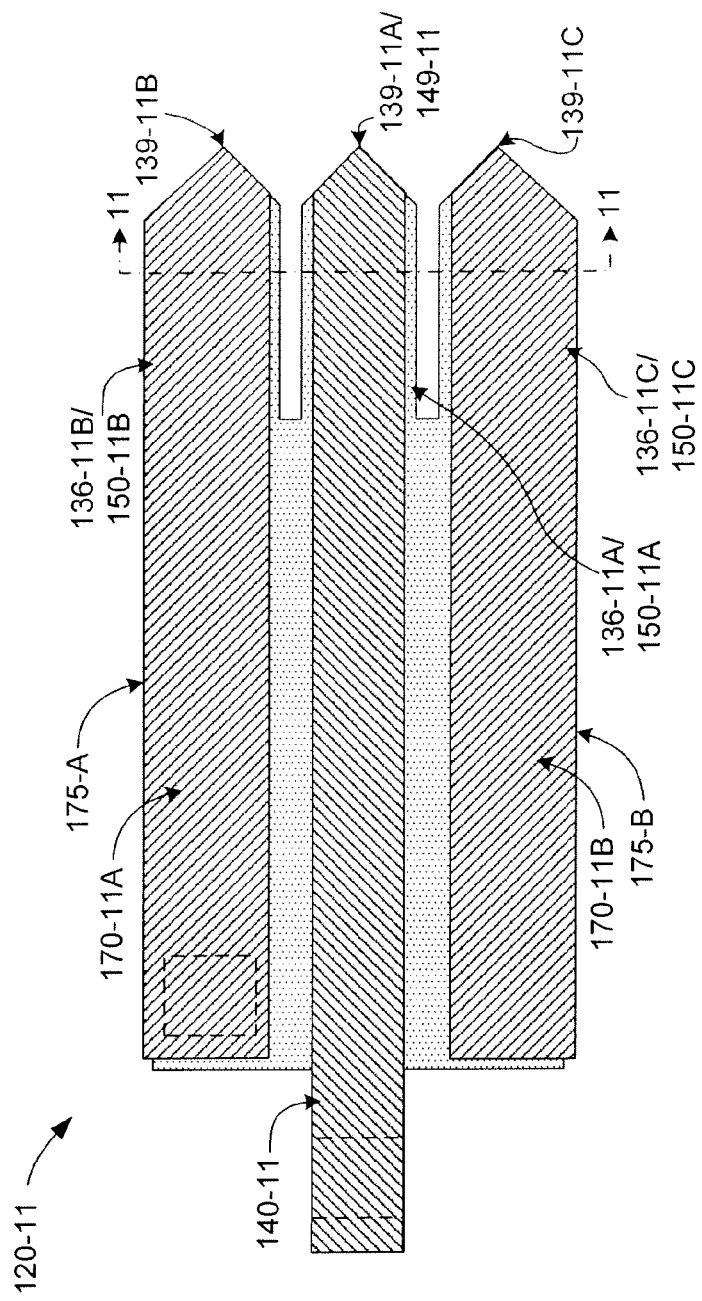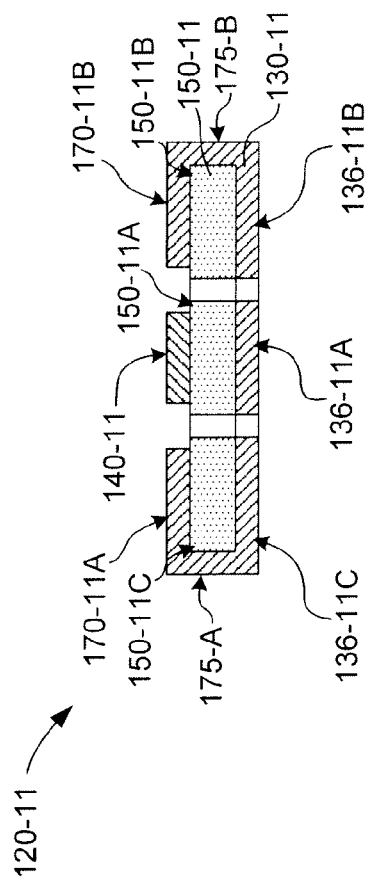
FIG. 11(A)
FIG. 11(B)

TRANSMISSION-LINE SPRING STRUCTURE

RELATED APPLICATIONS

This application is a divisional of U.S. patent application Ser. No. 10/913,904, entitled "Transmission-Line Spring Structure" filed Aug. 5, 2004 now abandoned.

FIELD OF THE INVENTION

This invention relates to transmission-line spring structures formed from self-bending materials, and more particularly to transmission-line test probes and interconnect structures formed from such spring structures.

BACKGROUND OF THE INVENTION

With clock frequencies rapidly approaching the microwave range, maintaining signal integrity and controlling electromagnetic interference in electronic (digital) systems is becoming increasingly difficult. Crosstalk through mutual trace inductances and capacitors, ground bounce, clock skew, signal reflections in incorrectly terminated routes, RF radiation and pickup can no longer be ignored as in previous, relatively low frequency digital systems. The various integrated circuit (IC)-to-package and package-to-printed circuit board (PCB) interconnects must now be treated as RF transmission lines, and the characteristic line impedances of the interconnects must be matched to the signal source impedance and kept constant over the various transitions from IC, through the IC package and socket, to the PCB.

Conventional IC-to-package and package-to-PCB interconnect structures (e.g., wirebond or flip-chip structures) are difficult to shield, and exhibit impedances that are very hard to control. The resulting signal integrity problem is fundamentally ignored in commercial high pin count, mass produced ICs (e.g., memory devices, microprocessors, and linear ICs) and associated systems. As a result, the maximum operation speed of these devices is limited by signal distortions due to interconnect mismatch, rather than transistor performance. In radio frequency integrated circuits (RFIC), the number of interconnects is much smaller (a few dozen at most), but the frequency limitations of bondwires significantly impact circuit performance. Careful bondwire shaping and extensive modeling of their artifacts are expensive but common practice in the industry. However, the inherent parasitic inductance of these bondwires remains an unaddressed problem.

What is needed is an efficient and economical spring structure for IC probing or permanent IC interconnects that overcomes the signal integrity problems of conventional structures.

SUMMARY OF THE INVENTION

The present invention is directed to a curved test probe or interconnect structure in which self-bending materials (e.g., stress-engineered materials, intermetallic compounds and/or bimorphs) are utilized to produce a transmission-line spring structure that, similar to a stripline or microstrip, includes a dielectric layer sandwiched between two elongated conductive layers, which form the signal and ground lines of the structure. Low cost and highly efficient photolithographic techniques are used to sequentially form the lower (first) conductive layer, the intermediate dielectric layer, and then the upper (second) conductive layer over a host substrate. The various layers are then processed (e.g., etched, released and annealed) to form curved transmission-line spring structures, each spring structure having an anchor region attached to the host substrate, a cantilever region extending from the anchor region and curving away from the substrate, and at least one tip structure located at a distal (free) end of the cantilever region. The upper conductive layer of the transmission-line spring structure provides a signal path between a contact pad on the host substrate and a second structure contacted by the tip. The lower conductive layer provides the ground path for the transmission line, and is connected to ground structures formed on the host substrate and/or second structure. Thus, the present invention provides a transmission-line spring structure that enables shielded and impedance matched transmission/probing of radio frequency (RF) or very fast logic signals. In addition, the transmission-line spring structures utilize substantially less contact area than conventional macro-scale RF probes, thereby facilitating placement directly over signal sources (e.g., over the center of an IC chip), thus producing shorter signal paths.

According to an aspect of the present invention, at least one of the two conductive layers is fabricated using one or more self-bending spring metals (e.g., stress-engineered, intermetallic and/or bimorphs) that facilitate selective and controllable bending of the transmission-line spring structure. In one specific embodiment, the first (lower) conductive layer is fabricated using one or more self-bending spring metals that lift the dielectric layer and second conductive layer formed thereon. In another specific embodiment, the second (upper) conductive layer is fabricated using self-bending spring metal(s) that lift the underlying dielectric and first conductive layers. In yet another specific embodiment, both the first and second conductive layers are fabricated using self-bending spring metals that cooperatively lift the intervening dielectric layer. In each of the above-mentioned specific embodiments, one or both of the first and second conductive layers includes a plated metal (e.g., gold, nickel and/or copper) to facilitate low resistance transmission of the applied signal.

According to an aspect of the present invention, the dielectric layer is formed using a stress-engineered dielectric material (e.g., silicon, silicon oxide, or silicon oxynitride deposited while gradually changing the atmospheric pressure inside the deposition chamber).

According to another aspect of the present invention, the transmission-line spring structure is formed with two or more tip structures by which the first and second elongated conductors are reliably and conveniently connected to corresponding contact pads on a second device.

BRIEF DESCRIPTION OF THE DRAWINGS

These and other features, aspects and advantages of the present invention will become better understood with regard to the following description, appended claims, and accompanying drawings, where:

FIGS. 6(A) and 6(B) are top plan and cross-sectional end views showing a two-tip spring structure according to another embodiment of the present invention;

FIGS. 7(A) and 7(B) are top plan and cross-sectional end views showing a two-tip spring structure according to another embodiment of the present invention;

FIGS. 8(A) and 8(B) are top plan and cross-sectional end views showing a three-tip spring structure according to another embodiment of the present invention;

FIGS. 10(A) and 10(B) are top plan and cross-sectional end views showing a three-tip spring structure according to another embodiment of the present invention; and FIGS. 11(A) and 11(B) are top plan and cross-sectional end views showing a three-tip spring structure according to another embodiment of the present invention.

DETAILED DESCRIPTION OF THE DRAWINGS

Figure 1:
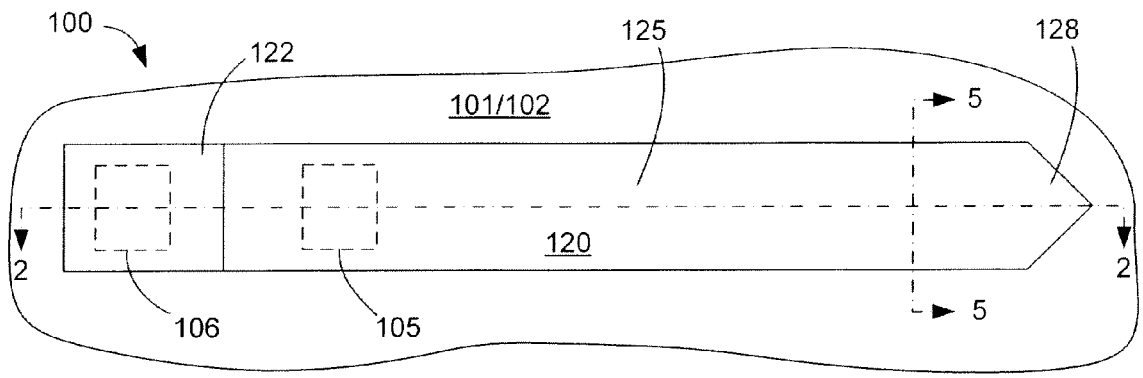
FIG. 1 is a top plan view showing a spring structure assembly according to an embodiment of the present invention.
Figure 2:
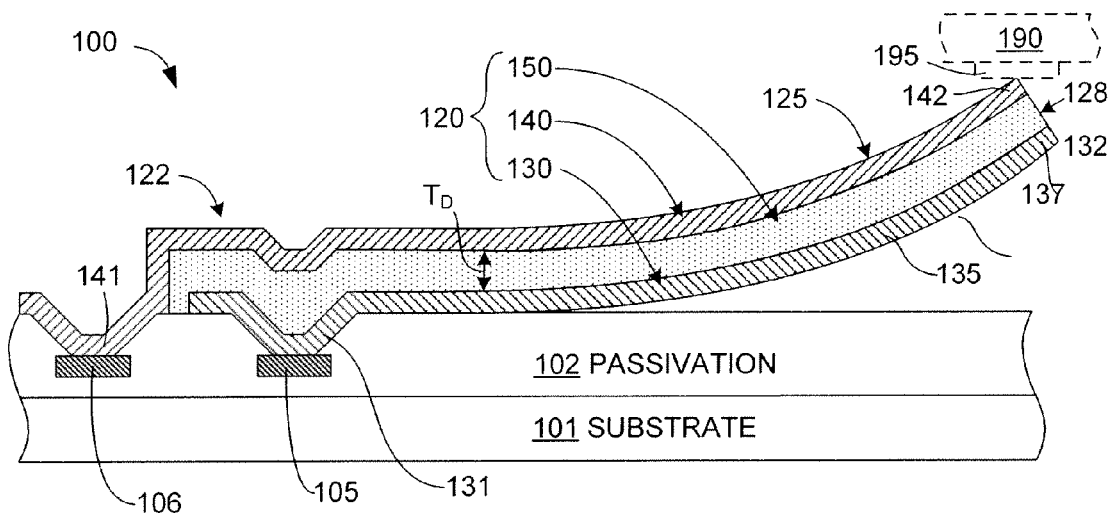
FIG. 2 is a cross-sectional side view taken along section line 2-2 of FIG. 1.

FIGS. 1 and 2 are top plan and cross-sectional side views, respectively, showing a spring structure assembly 100 according to a first embodiment of the present invention. Assembly 100 includes a substrate 101 having a passivation (or other insulator) layer 102 formed thereon, and contact pads 105 and 106 that are supported by passivation layer 102 such that contact pads 105 and 106 are electrically insulated from each other. In addition, assembly 100 includes a transmission-line spring (i.e., test probe or interconnect) structure 120 having an anchor region 122 attached to substrate 101 (i.e., via passivation layer 102 and/or zero or more intervening structures), a curved cantilever region 125 extending from anchor region 122 away from substrate 101, and at least one tip 128 located at a distal (free) end of cantilever region 122. The curved shape of transmission-line spring structure 120 is generated using one or more self-bending materials in the manner described below with reference to the specific embodiments.

Referring to FIG. 2, according to an aspect the present invention, transmission-line spring structure 120 includes a lower (first) elongated conductive layer 130 and an upper (second) elongated conductive layer 140 that are separated by a dielectric layer 150. Lower conductive layer 130 includes a fixed (first) end 131 electrically connected to (first) contact pad 105, and a free (second) end 132 located adjacent to tip 128. Similarly, upper conductive layer 140 includes a fixed (first) end 141 connected to (second) contact pad 106, and a free (second) end 142 located adjacent to tip 128. Dielectric layer 150 is located between lower conductive layer 130 and upper conductive layer 140 such that the conductive layers are separated by a uniform distance (i.e., the thickness TD of dielectric layer 150) along their respective lengths (i.e., between anchor region 122 and tip 128).

When utilized as a test probe or interconnect structure in an electronic system, transmission-line spring structure 120 provides a microstrip-type transmission line structure that greatly enhances the transmission of high frequency signals between a host device (e.g., an integrated circuit formed on substrate 101) and a target (second) device 190 that is contacted by tip 128. In one embodiment, lower conductive layer 130 is maintained at a predetermined ground potential via contact pad 105, and a high frequency signal that is generated, for example, by electronic circuitry formed on substrate 101, is transmitted onto upper elongated conductor 140 via contact pad 106. As indicated in FIG. 2, a contact pad 195 of a second device 190 is contacted by end 142 of upper conductive layer 140, thereby forming a conductive path for transmitting the high frequency signal from substrate 101 to a corresponding circuit associated with second device 190. An optional second connection to first conductive layer 130 (not shown), which is typically required to support high frequency transmissions, is discussed below with reference to multi-tip embodiments. Due to the proximity of the ground plane provided by first conductive layer 130, the signal is transmitted on second conductive layer 140 with a substantially greater efficiency than is possible using conventional single-wire test probe and interconnect structures. Thus, transmission-line spring structures formed in accordance with the present invention provide a substantial improvement over conventional wirebond IC interconnect and test probe structures by facilitating matched impedance transmissions from a first IC device to a host PCB, and/or from the host PCB to a second IC device, thereby providing a highly versatile and extremely clean signal transfer mechanism.

Another advantage of transmission-line spring structure 120 over conventional interconnect and test probe structures is that transmission-line spring structure 120 requires substantially less contact area than conventional transmission-line structures, thereby facilitating shorter signal distances because transmission-line spring structures 120 can be placed closer to the signal source. The landing pads for the commercially available transmission-line probes are rather big (e.g., 50 μm by 50 μm each on a 100 μm pitch), and are therefore often placed in the dicing lanes of a wafer to preserve precious wafer space. This approach, however, requires routing signals of interest that are generated in the center of the IC to the circuit perimeter, thus increasing the overall signal path. Due to the substantially smaller contact region of transmission-line spring probe 120 (i.e., approximately 25 μm by 25 μm on a 38 μm pitch), the present invention facilitates placing transmission-line contact structures directly over the locations where signals of interest are generated (e.g., in the center of the chip), thereby simplifying signal routing and reducing chip size by eliminating interconnects to the external chip regions.

As described below with reference to following practical embodiments, at least one of lower conductive layer 130, upper conductive layer 140, and dielectric layer 150 is fabricated using one or more self-bending materials that facilitate selective and controllable bending of transmission-line spring structure 120, thereby producing the characteristic curved shape depicted in FIG. 2.

According to an embodiment of the present invention, at least one of lower conductive layer 130 and upper conductive layer 140 is fabricated using one or more self-bending spring metals (e.g., stress-engineered metals, intermetallic compositions, and/or bimorph metal structures) that facilitate selective and controllable bending of transmission-line spring structure 120. The phrase "spring metal" is defined herein as a metal film having a non-zero internal mechanical stress when formed or subsequently annealed that causes the metal film to bend (curl) away from the substrate after release. In one embodiment, spring metals include one or more stress-engineered metal films (described below), intermetallic compositions, and/or bimorphs. Spring metals may include non-metal components.

According to another embodiment of the present invention, one or both of lower conductive layer 130 and upper conductive layer 140 includes a plated metal layer that serves to increase electrical conductivity. The phrase "plated metal" refers to one or more electrically conductive metals that are formed using established plating techniques (e.g., electroplating or electroless plating) either before or after the release process. For example, lower conductive layer 130 and/or upper conductive layer 140 may be formed using stress-engineered plated metal that is deposited prior to release of the spring structure. Alternatively, one or more plated metal layers may be formed after release of the spring structure (e.g., electroplating Copper, Nickel and/or gold over selected regions of the released spring structure). Although thick plated metal layers have superior conductive characteristics to thin sputtered metal layers, it may not in all cases be necessary to perform post-release plating of such sputtered metals. Therefore, the use of plated metals may be omitted in some embodiments.

Figure 3:
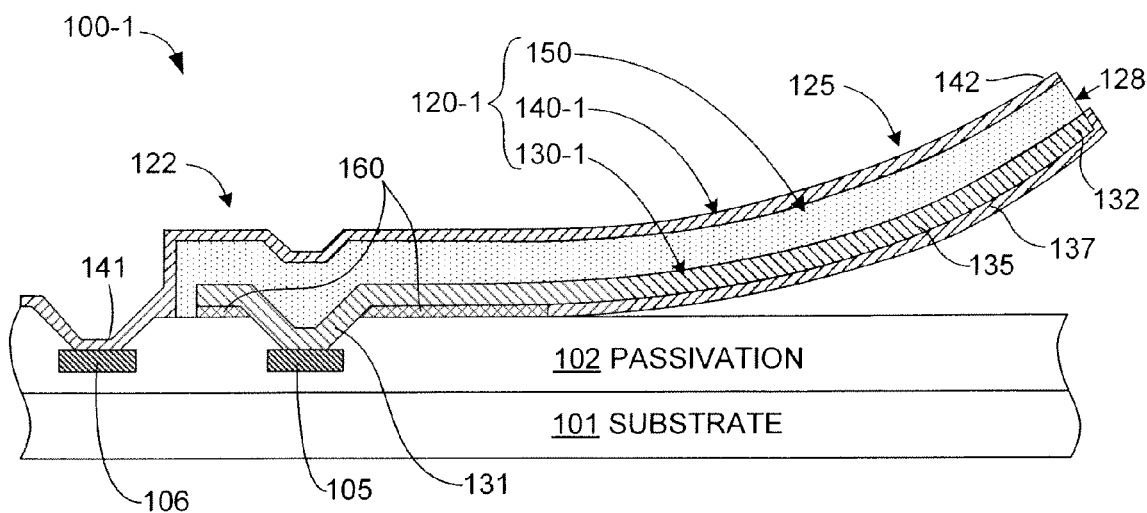
FIG. 3 is a cross-sectional side view showing a spring structure assembly according to another embodiment of the present invention.

FIG. 3 is a cross-sectional side view showing an assembly 100-1 according to a first specific embodiment of the present invention. Structures that are similar or identical to those introduced above with reference to assembly 100 are assigned the same or similar reference numbers, and structures identical to those utilized in assembly 100 will not be discussed in detail for sake of brevity.

Assembly 100-1 includes an intermediate structure 160 that is formed between anchor region 122 of transmission-line spring structure 120-1 and substrate 101. As described in additional detail below, intermediate structure 160 is formed from a retained portion of a sacrificial (release material) layer that is removed (e.g., etched) during the release process.

Assembly 100-1 also includes a transmission-line spring structure 120-1 having a two-part lower conductive layer 130-1, dielectric layer 150 formed on lower conductive layer 130-1, and a plated metal upper conductive layer 140 formed on dielectric layer 150. Lower conductive layer 130-1 includes a spring metal layer 135 and a plated metal layer 137. Fixed end 131 of spring metal layer 135 is formed on intermediate structure 160 and extends through an opening thereof to contact first contact pad 105. Plated metal layer 137 is formed during a post-release plating process over all exposed portions of spring metal layer 135 including free end 132.

FIGS. 4(A) to 4(F) depict a fabrication process for generating assembly 100-1 according to an exemplary embodiment of the present invention.

Figure 4A:
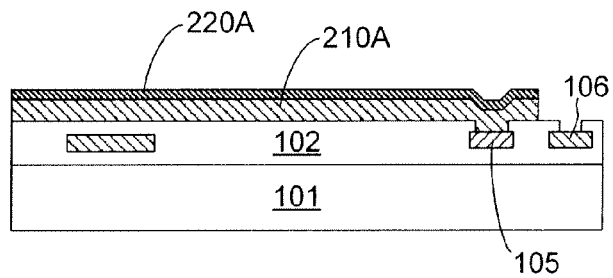
FIGS. 4(A), 4(B), 4(C), 4(D), 4(E), and 4(F) are cross-sectional side views depicting a fabrication process for generating the spring structure of FIG. 3.

Referring to FIG. 4(A), after defining vias through passivation layer 102 that expose contact pads 105 and 106, a release layer and a seed layer are sequentially deposited and patterned to form a network of release layer islands 210A that include a (first) seed layer 220 formed thereon, with, in one embodiment, the network of release layer islands 210A connected together to facilitate subsequent electroplating. Note that the vias exposing contact pads 105 and 106 are already provided on commercially manufactured wafers.

The purpose of release layer island 210A is to facilitate a selective etching process that releases portions of the spring film from substrate 101/passivation layer 102 to form curved spring structures. As described below, the material utilized to form release layer island 210A is selected such that substrate 101/passivation layer 102 and the spring structures are not significantly damaged (e.g., etched) during the release process (i.e., the selective under-etching of the spring structure in the manner described below), and an anchor region of each spring structure remains connected to substrate 101 via a portion of release layer island 210A (i.e., intermediate structure 160; see FIG. 3) after the release process is completed. In these embodiments, release layer island 210A is matched with the subsequently formed spring film material such that the spring material adheres to the release material. Suitable release materials include, for example, one or more of silicon (Si), a silicon nitride composition (SiNx), a silicon oxide composition (SiOx), silicon oxynitride, or titanium (Ti) that is deposited onto passivation layer 102 using known techniques. In an alternative embodiment (not shown), a separate anchor pad is formed adjacent to the release material that is not removed during the selective etch, and serves to connect the spring probe to substrate 101. In yet another alternative embodiment, passivation layer 102 may itself be used as a release layer, (i.e., release film island 210A is not formed, and spring metal film 220 is formed directly on passivation layer 102), and the release process involves, for example, selectively etching into the passivation layer 102 to release the spring structure (note that removing a protective passivation layer would under most circumstances be undesirable, but may be utilized, for example, when a two-layer passivation is provided).

Figure 4B:
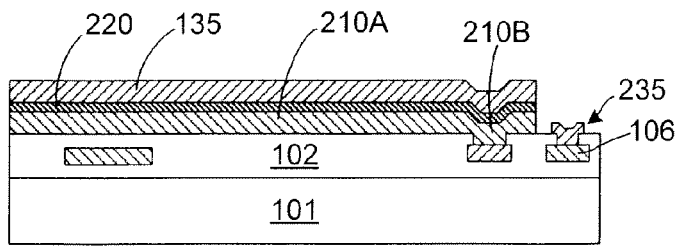

FIG. 4(B) depicts the formation (e.g., sputtering and/or electroplating) of spring metal portion 135, and an optional second seed layer (not shown), which is utilized in some two-tip and three-tip embodiments described below. In one embodiment, spring metal portion 135 is formed in a subtractive manner by depositing (e.g., sputtering) a layer of stress-engineered spring metal in a controlled manner such that lowermost portions (i.e., the film material located closest to release layer island 210A) has a higher internal compressive stress than uppermost portions (i.e., the film material located furthest to release layer island 210A), thereby forming internal stress variations in the growth direction (e.g., a stress gradient that increases in the direction perpendicular to the upper surface of substrate 101). A mask is then formed over the spring metal layer, and the layer is etched using known techniques to form spring metal portion 135. The thickness of spring metal portion 135 is determined in part by the selected spring material, formation technique, desired spring constant, and shape of the final spring structure.

Sputter-based methods for forming spring metal portion 135 such that it has a suitable stress gradient are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, stress-engineered spring metal portion 135 includes one or more metals suitable for forming a spring structure (e.g., one or more of molybdenum (Mo), a "moly-chrome" alloy (MoCr), tungsten (W), a titanium-tungsten alloy (Ti:W), chromium (Cr), nickel (Ni) and a nickel-zirconium alloy (NiZr)).

According to another embodiment, spring metal portion 135 is formed in an additive manner by first forming a mask, and then depositing a plated metal (e.g. Ni, Cu, alloys) onto seed layer 220 (e.g. Au, Ni) through an opening in the mask using electroplating or electroless plating techniques. Similar to the sputtered embodiment described above, in one embodiment the process parameters are changed during plating to generate a suitable stress gradient, although it is possible to form a suitable film without changing the process parameters. According to an aspect of the present embodiment, a plating chemistry is used that deposits at least two elements into the film that can subsequently be transformed to an intermetallic phase using an annealing process to initiate bending of the spring structure such that its tip is positioned at the target distance away from the underlying substrate. In one specific embodiment, an Au seed layer is lithographically patterned and then sequentially exposed to an $Ni_3P$ (first) solution, which forms a relatively compressive lower spring layer portion on the release layer, and then an $Ni_3B$ (second) solution, which forms a relatively tensile upper spring layer portion on the lower spring layer portion. Other plated spring types may include Cu with various hardening materials added thereto that are formed using either electroless plating or electroplating.

As indicated at the right side of FIG. 4(B), the resulting island of layered material is formed over contact pad 105, but contact pad 106 spaced from the stack. To prevent possible damage to contact pad 106 during subsequent processing, an optional protective cap 235 is formed over contact pad 106 during the subsequent spring metal deposition. Note that the protective cap is omitted in subsequently discussed FIGS. 4(C) through 4(F) for brevity. Note also that release layer island 210A includes a portion 210B that provides electrical contact between the stack and contact pad 105 (i.e., when a conductive release material is used).

Figure 4C:
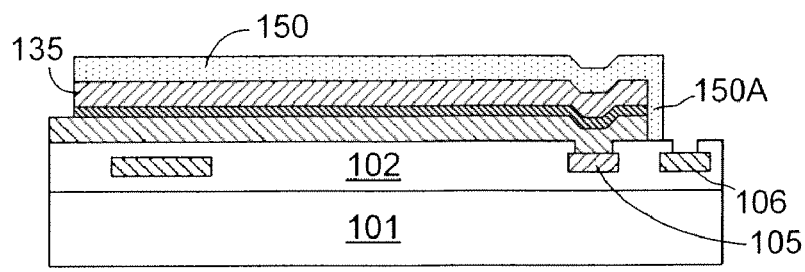

FIG. 4(C) depicts the process of depositing and subsequently patterning dielectric layer 150 over spring metal portion 135. Dielectric layer 150 (e.g., polyimide, BCB, or an organic dielectric such as silicon oxide, silicon nitride, or silicon oxynitride) is formed using known techniques, and includes a portion 150A that extends vertically along the layered stack between contact pads 105 and 106.

Figure 4D:
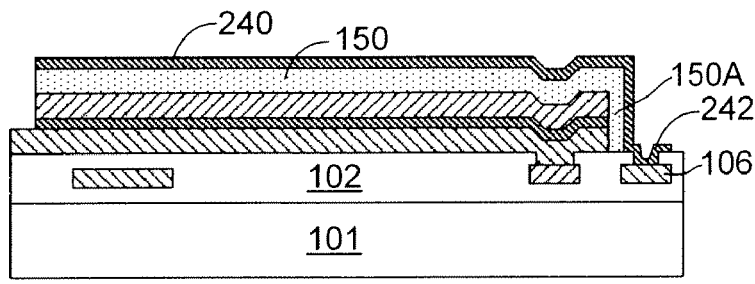

FIG. 4(D) shows a plating seed layer 240 patterned over dielectric layer 150 using well-known techniques such that a portion 242 extends down dielectric portion 150A and contacts contact pad 106 (or protective cap 235, shown in FIG. 4(B), when used).

Figure 4E:
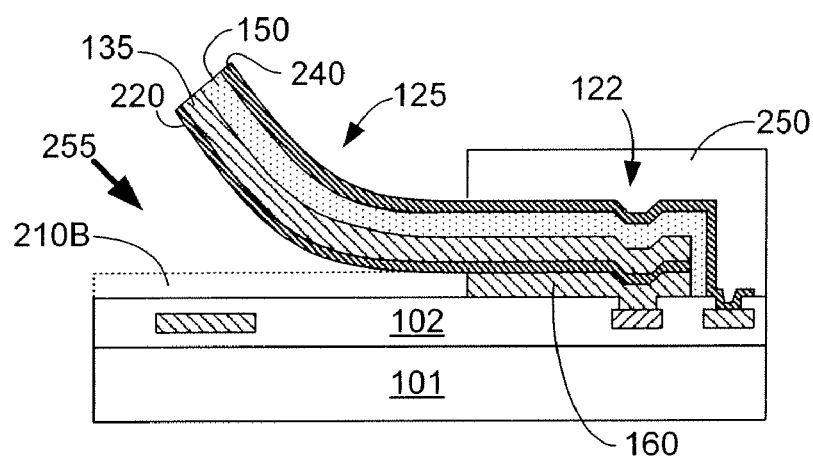

FIG. 4(E) depicts a release process in which the stack is released by forming a release mask 250 over anchor region 122 of the stack, and under-etching cantilever region 125 of the stack. Release mask 250 is spun and patterned using known techniques. Under-etching is performed using a suitable etchant 255 (e.g., hydrofluoric acid) for Ti release material), and is timed to obtain the desired undercut distance (i.e., such that a portion 210B located under the cantilever is removed, but intermediate structure 160 is retained under anchor portion 122). Perforations in the stack facilitate faster etching and tighter process control. Upon removing portion 210B, cantilever region 125 bends relative to substrate 101 according to the self-bending characteristics of the selected spring metal (e.g., stress gradient and/or in response to a post-release annealing process).

Figure 4F:
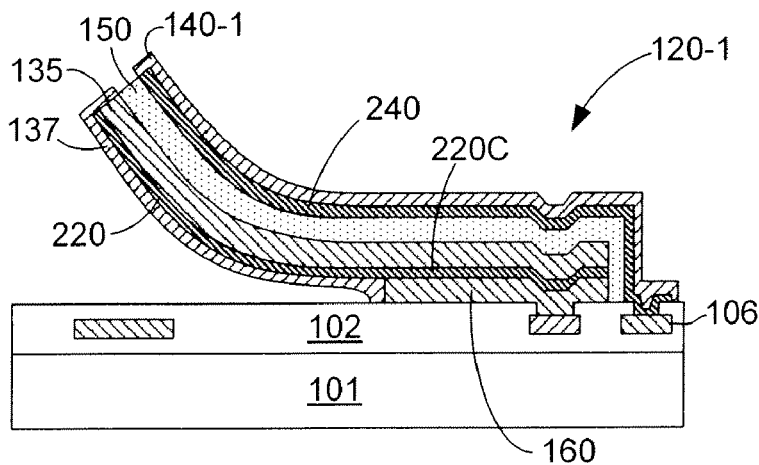

Finally, as indicated in FIG. 4(F), plating is performed, for example, on all exposed surfaces of seed layers 220 and 240 to form plated metal layer 137 on spring metal layer 135, and plated metal layer 140-1 on the upper surface of dielectric layer 150, thereby completing spring structure 120-1. Note that spring metal layer 135 is electrically connected to contact pad 105 by way of a seed layer portion 220C and/or intermediate structure 160, both comprising conductive materials. Note also that plated metal layer 140-1 is separated from spring metal layer 135 by dielectric layer 150, and contacts contact pad 106. The release mask is then removed, and any remaining exposed release material covered by the release mask is etched.

Plating adds metal either in the presence of an applied current, electroplating, or through a surface chemical reaction (i.e., electroless plating). One of the factors to consider is that conventional methods for plating released springs, such as those described in U.S. Pat. No. 6,528,350 (incorporated herein by reference in its entirety), are able to plate the entire surface of the spring, including its top, edges and underside. In the case of a released transmission-line spring structure, such as spring structure 120-1, it is desired to avoid shorting the upper and lower conductive layers together, as this would produce a shunt in the transmission-line spring structure. One needs also consider what the increase in the dimensions of the conductor will have on the transmission line impedance. The avoidance of shorts can be accomplished by ensuring that the starting unplated surfaces and edges are of the proper dimensions to produce the final desired geometry after plating. This may require locating the edges of the plating seed layers inboard from the edges of the dielectric layer such that the subsequently formed plated metal remains on the dielectric surface and does not extend over the side edge. It will be well understood within this area of practice that proper mask design and etch times can be employed to achieve this result.

Figure 5A:
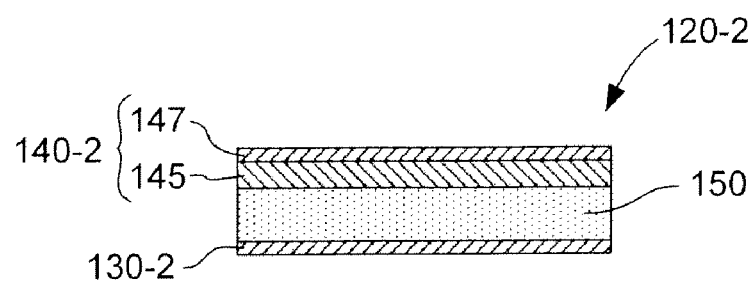
FIGS. 5(A), 5(B), 5(C), and 5(D) are cross-sectional end views showing portions of spring structures according to various alternative embodiments of the present invention.

Those skilled in the art will recognize that the embodiment depicted by FIGS. 4(A) through 4(F) represents only one of several possible methods that can be utilized to produce assembly 100-1. For example, in an alternative embodiment, silicon may be used in place of Ti to form release layer island 210A (described above), with the subsequent release operation performed using a dry $XeF_2$ etch. FIG. 5(A) is a cross-sectional end view taken along line 5-5 of FIG. 1 showing a spring structure 120-2 according to another embodiment of the present invention. Similar to spring structure 120-1 (FIG. 3), spring structure 120-2 includes a dielectric layer 150 sandwiched between a lower conductive layer 130-2 and an upper conductive layer 140-2. Lower conductive layer 130-2 in this case comprises a plated metal layer formed in a manner similar to that described above with reference to upper conductive layer 140-1. In addition, upper conductive layer 140-2 is made up of a two-part structure including a spring metal layer 145 and an optional plated metal layer 147 respectively formed in a manner similar to spring metal layer 135 and a plated metal layer 137 of spring structure 120-1. Spring structure 120-2 operates in a manner similar to spring structure 120-1, with the exception that spring metal layer 145 acts to lift dielectric layer 150 into the characteristic bent position (as opposed to pushing up dielectric layer 150, which is described above with reference to spring structure 120-1).

Figure 5B:
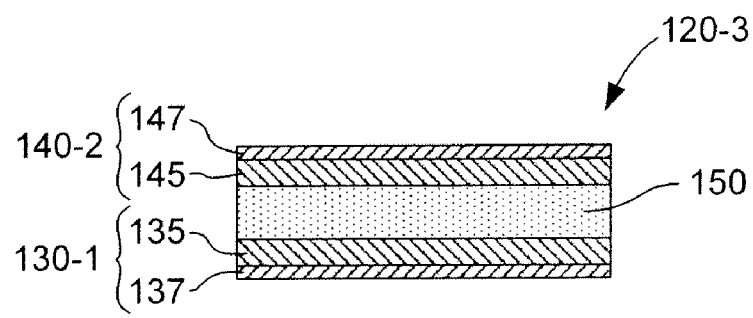

FIG. 5(B) is a cross-sectional end view taken along line 5-5 of FIG. 1 showing a spring structure 120-3 according to another embodiment of the present invention. Spring structure 120-3 includes a dielectric layer 150 sandwiched between two-part lower conductive layer 130-1 (described above with reference to FIG. 3) and a two-part upper conductive layer 140-2 (described above with reference to FIG. 5(A)). That is, lower conductive layer 130-1 includes both spring metal layer 135 and plated metal layer 137, and upper conductive layer 140-2 includes spring metal layer 145 and plated metal layer 147. By providing two spring metal layers on opposite sides of dielectric layer 150, and by making upper spring metal layer 145 relatively tensile and lower spring metal layer 135 relatively compressive, spring structure 120-3 exhibits a greater bending moment for given film stresses than the embodiments described above using only a single spring metal layer.

Although the use of spring metal is presently preferred for achieving the self-bending characteristics of the transmission-line spring structures associated with the present invention, it is also possible to utilize stress-engineered dielectric materials, such as oxides and/or nitrides of silicon, thus facilitating the omission of spring metals from the transmission-line spring structure.

Figure 5C:
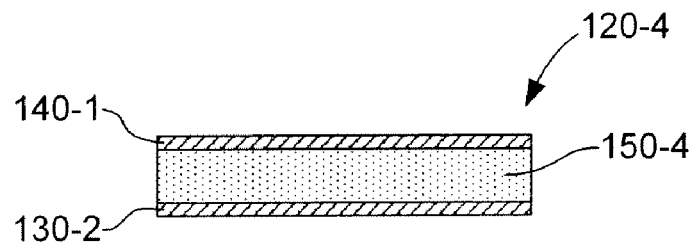

FIG. 5(C) is a cross-sectional end view taken along line 5-5 of FIG. 1 showing a spring structure 120-4 including a stress-engineered dielectric layer 150-4 sandwiched between plated metal conductive layers 130-2 and 140-1 (both described above). Suitable stress-engineered inorganic dielectric materials including oxides and/or nitrides of silicon that are sputter deposited in the manner described above with reference to stress-engineered metal layers (e.g., by gradually changing deposition chamber pressure during layer formation).

Figure 5D:
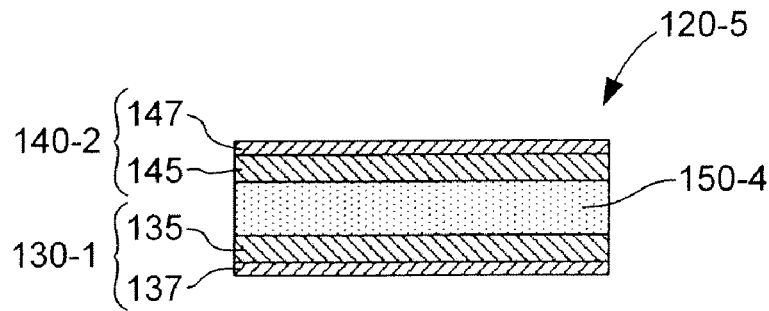

FIG. 5(D) is a cross-sectional end view taken along line 5-5 of FIG. 1 showing yet another spring structure 120-5 including stress-engineered dielectric layer 150-4 sandwiched between two-part lower conductive layer 130-1 and two-part upper conductive layer 140-2 (both described above). By combining the lifting (bending) forces generated by spring metal layers 135 and 145 and stress-engineered dielectric layer 150-4, a maximum upward bending force is provided upon release of spring structure 120-5. Note that, as above, plated metal layers 137 and 147 are optional, and may be omitted when spring metal layers 135 and 145 exhibit sufficient conductivity.

The single-tip spring structures described above are suitable for applications in which only the signal line (e.g., upper conductive layer 140) is connected to a second IC device (e.g., device 190, as shown in FIG. 2). However, due to the very small offset between the tips of the upper and lower conductive layers, in some applications it may be very difficult to connect the ground line (e.g., lower conductive layer 130) to the second device. Thus, the single-tip arrangement may not be suitable for applications in which it is desired to connect both signal and ground lines to the second device.

According to another aspect of the present invention, which is described with reference to the various embodiments presented below, transmission-line spring structures of the present invention are provided with two or more separated tip (contact) structures by which both the upper and lower conductors are reliably and conveniently connected between a host substrate and a second structure. As mentioned above, at high frequencies where the spring structure would work as a transmission line, the signal transfer is only going to work properly if the ground path also connects to the second device 190 (i.e., proximity alone will not produce the desired electrostatic shielding effect).

FIGS. 6(A) and 6(B) are top plan and cross-sectional side views showing a spring structure 120-6 according to a first two-tip embodiment of the present invention. As in the previous embodiments, spring structure 120-6 includes a lower conductive layer 130-6, an upper conductive layer 140-6, and a dielectric layer 150-6 sandwiched therebetween. However, as indicated in FIG. 6(A), lower conductive layer 130-6 includes two parts: a first layer portion 136-6A defining a first tip 139-6A, and a second layer portion 136-6B that extends parallel to first layer portion 136-6A and defines a second tip 139-6B. Dielectric layer 150-6 is formed on first layer portion 136-6A, and extends along its length to tip 139-6A. Note that second layer portion 136-6B of lower conductive layer 130-6 is exposed along its entire length between anchor region 122-6 and second tip 139-6B (also shown in FIG. 6(A)). Upper conductive layer 140-6 is formed as described above on dielectric layer 150-6, and extends from contact pad 106 to a tip portion 149-6 that is located over tip 139-6A of layer portion 136-6A. With this two-tip structure, spring structure 120-6 provides a convenient mechanism for connecting lower conductive layer 130-6 and upper conductive layer 140-6 to a second IC device by way of tip 139-6B and tip portion 149-6, respectively (i.e., by bringing these tip structures into contact with corresponding contact pads of the second device). Note that lower conductive layer 130-6, dielectric layer 150-6, and upper conductive layer 140-6 are formed using, for example, spring metal, plated metal and/or stress-engineered material, according to any of the exemplary embodiments described above. Note also that layer portions 136-6A and 136-6B are integrally formed near anchor region 122-6 of spring structure 120-6, but are separated by a slot 138-6 adjacent to the free end of spring structure 120-6. This slot arrangement and lack of dielectric material on second layer portion 136-6B facilitates a greater upward displacement of tip 139-6B (as compared to tip 139-6A), thereby allowing tip 139-6B to become parallel with tip portion 149-6.

FIGS. 7(A) and 7(B) are top plan and cross-sectional side views showing a spring structure 120-7 according to a second two-tip embodiment of the present invention. Similar to spring structure 120-6, spring structure 120-7 includes a lower conductive layer 130-7 and an upper conductive layer 140-7 separated by a dielectric layer 150-7. Lower conductive layer 130-7 includes a first layer portion 136-7A defining a first tip 139-7A, and a second layer portion 136-7B defining a second tip 139-7B. In this embodiment, dielectric layer 150-7 includes a first portion 150-7A formed on layer portion 136-7A, and a second dielectric portion 150-7B extending along second layer portion 136-7B. Upper conductive layer 140-7 is formed on portion 150-7A of dielectric layer 150-7, and extends from contact pad 106 to a tip portion 149-7 that is located over tip 139-7A. Finally, dielectric portion 150-7B terminates adjacent to the free end of spring structure 120-7 such that second tip 139-7B is exposed (i.e., extends from an edge of dielectric portion 150-7B).

Spring structure 120-7 operates essentially as described above, but the additional dielectric portion 150-7B that covers second cantilever region 136-7B produces a balanced stiffness over lower conductive layer 130-7, which can in some instances prevent twisting of the completed structure. That is, a potential problem with first two-tip structure 120-6 is that, due to the unbalanced stiffness on lower conductive layer 136-6 (i.e., due absence of dielectric material on second cantilever region 136-6B), second cantilever region 136-6B may twist along its length, thereby resulting in an undesirable curled structure (e.g., with tip 139-6B located over tip portion 149-6). This twisting problem is addressed in spring structure 120-7 by providing dielectric portion 150-7B to balance the stiffness on lower conductive layer 136-7, thereby reducing the chance of twisting and causing the tip portions 139-7B and 149-7 to achieve a uniform height above an underlying substrate (not shown).

As suggested above, two-tip spring structure 120-6 may exhibit undesirable twisting that may be remedied by forming dielectric material over most of the lower conductor layer. Another approach to resist twisting and to further enhance electrical characteristics by further shielding the signal line is to utilize a three-tip spring structure arrangement, such as those described in the following exemplary embodiments.

FIGS. 8(A) and 8(B) are top plan and cross-sectional side views showing a spring structure 120-8 according to a first three-tip embodiment of the present invention. Spring structure 120-8 includes a lower conductive layer 130-8 and an upper conductive layer 140-8 separated by a dielectric layer 150-8. Lower conductive layer 130-8 includes a first layer portion 136-8A defining a first tip 139-8A, a second layer portion 136-8B defining a second tip 139-8B, and a third layer portion 136-8C defining a third tip 139-8C. All three layer portions extend in parallel, with first layer portion 136-8A located between second layer portion 136-8B and third layer portion 136-8C, with a first slot 138-8A defined between layer portions 136-8A and 136-8B, and a second slot 138-8B defined between layer portions 136-8A and 136-8C. Dielectric layer 150-8 is formed only on layer portion 136-8A, and extends along its entire length to tip 139-8A (i.e., both second layer portion 136-8B and third layer portion 136-8C are exposed). Upper conductive layer 140-8 is formed on dielectric layer 150-8 in the manner described above, and extends from contact pad 106 to a tip portion 149-8 that is located over tip 139-8A.

Figure 8C:
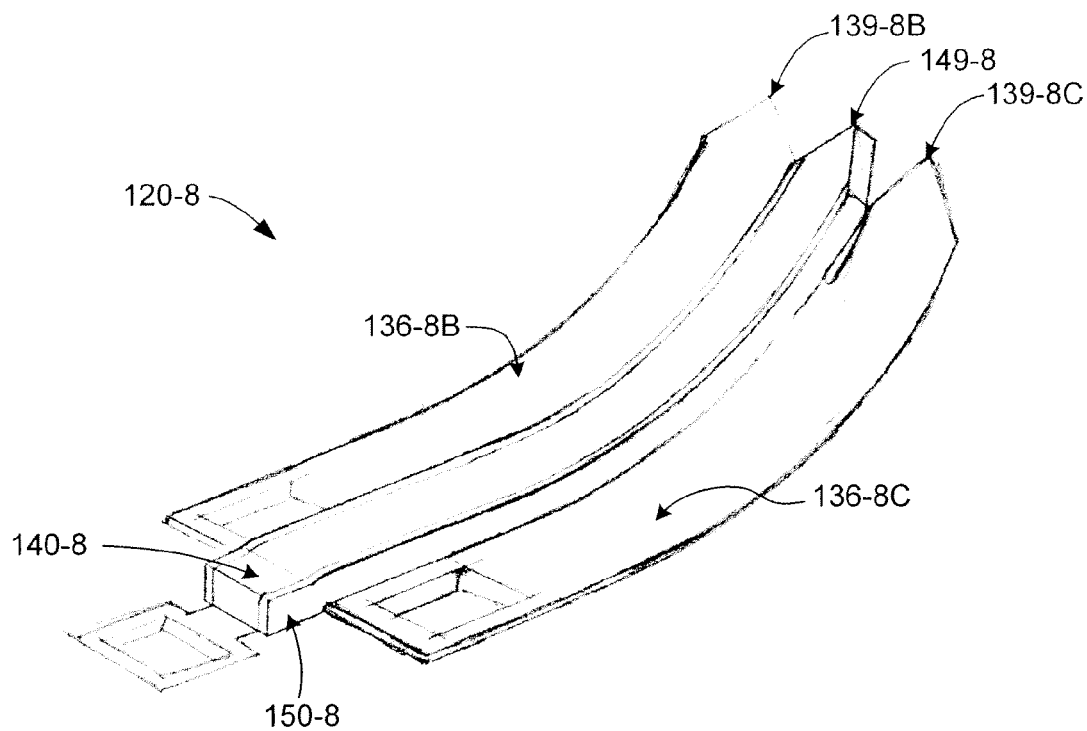
FIGS. 8(C) and 8(D) are perspective views showing the spring structure of FIG. 8(A) in additional detail.
Figure 8D:
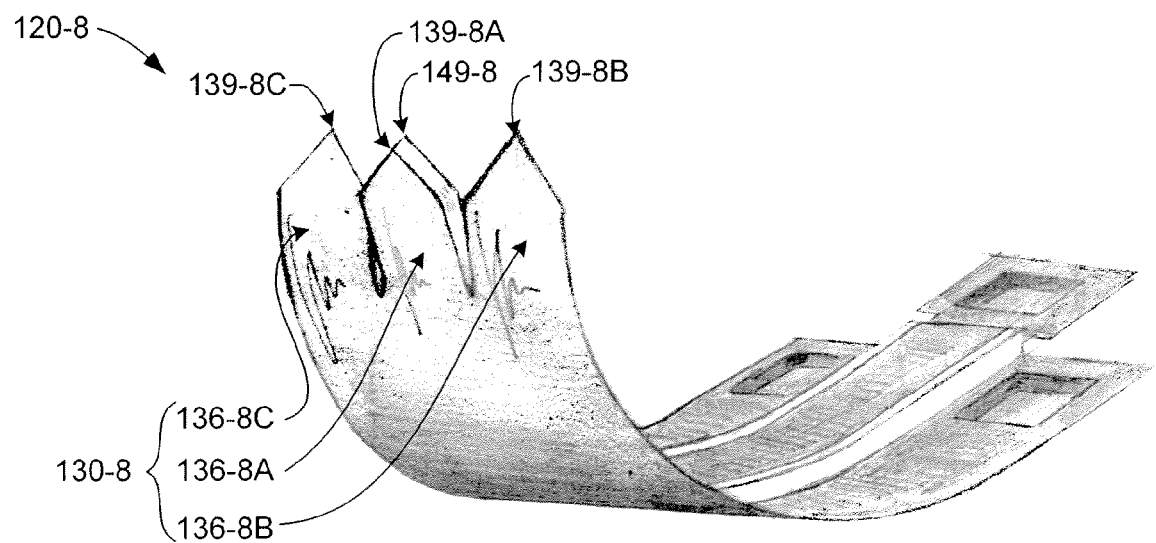

FIGS. 8(C) and 8(D) are front and rear perspective views showing spring probe 120-8 in additional detail. As indicated in these figures, a benefit of the three-tip structure is the balanced bending force generated by layer portions 136-8B and 136-8C that resists twisting due to the presence of dielectric layer 150-8 on layer portion 136-8A. Note also that, as indicated in FIG. 8(D), due to the absence of dielectric material on layer portions 136-8B and 136-8C, tips 139-8B and 139-8C are positioned somewhat higher than tip 139-8A, which under ideal conditions brings tips 139-8B and 139-8C level with tip portion 149-8. An advantage of spring structure 120-8 is reduced ground strip resistance due to the exposure (and plating) of layer portions 136-8B and 136-8C.

Figures 9A, 9B:
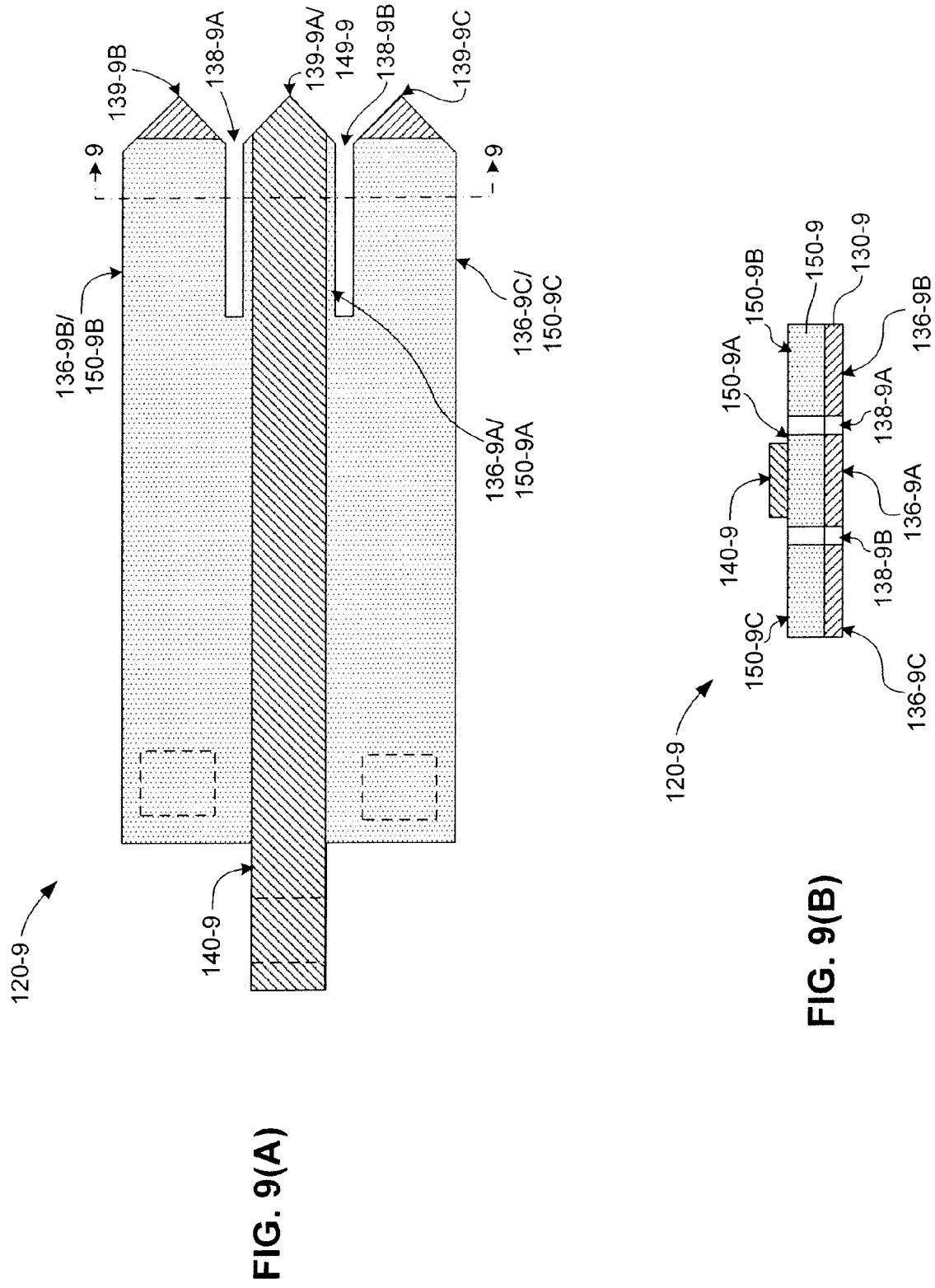
FIGS. 9(A) and 9(B) are top plan and cross-sectional end views showing a three-tip spring structure according to another embodiment of the present invention.

FIGS. 9(A) and 9(B) are top plan and cross-sectional side views showing a spring structure 120-9 according to a second three-tip embodiment of the present invention. Spring structure 120-9 includes a lower conductive layer 130-9 and an upper conductive layer 140-9 that are essentially identical to those of spring structure 120-8, but utilizes a dielectric layer 150-9 that extends across all three portions of lower conductive layer 130-9. In particular, dielectric layer 150-9 includes a first dielectric portion 150-9A extending along first layer portion 136-9A, a second dielectric portion 150-9B extending along second layer portion 138-9B, and a third dielectric portion 150-9C extending along the third layer portion 138-9C. Similar to spring structure 120-7 (discussed above), second dielectric portion 150-9B and third dielectric portion 150-9C terminate at a point adjacent to second tip 139-9B and the third tip 139-9C, respectively, thereby exposing these tips for contact with a second device. A first slot 138-9A is defined between layer portions 136-9A and 136-9B, and a second slot 138-9B is defined between layer portions 136-9A and 136-9C. Upper conductive layer 140-9 is formed on dielectric layer 150-9 over first layer portion 136-9A in the manner described above, and includes a tip portion 149-8 that is located over tip 139-9A.

In one exemplary embodiment, spring structures having lengths of 400 µm that are consistent with spring structures 120-8 and 120-9 (discussed above) can be produced using MoCr spring metal having a thickness of 0.5 µm and an internal stress of 1 GPa (compressive), and the dielectric layers produced using BCB having a thickness of 13.5 µm and an internal stress of 0.028 GPa (tensile). Gold plating seed (0.1 µm thick) can be provided on the lower side of the lower conductive layer and on the dielectric layer prior to release. A Ti release layer can be utilized in the manner described above. Based on calculated values, after release (prior to plating), spring structures consistent with spring structure 120-9 would achieve an approximately 935 µm radius and an approximately 84 µm lift (tip) height. In contrast, spring structures consistent with spring structure 120-8, due to the reduced dielectric weight, would achieve a lift height of 183 µm. However, the stiff BCB "spine" extending along the length of the spring structure would increase its tendency to cup instead of curl during release (i.e., the outer layer portions twisted inward toward the central layer portion). Using the full width BCB associated with spring structure 120-9, but only partially curing the BCB layer before release, a tighter radius and higher lift can be produced without this cupping problem. The BCB can then be cured to completion (i.e., after spring release).

As indicated above, ground strip resistance can be reduced by plating exposed upper surfaces of the lower conductive layer, but this plating is not possible when a full width dielectric layer is used. The embodiments described below with reference to FIGS. 10 and 11 combine a full-width dielectric and additional conductive layers to both reduced ground strip resistance and increase shielding of the signal line.

FIGS. 10(A) and 10(B) are top plan and cross-sectional side views showing a spring structure 120-10 according to a third three-tip embodiment of the present invention. Spring structure 120-10 includes a lower conductive layer 130-10, an upper conductive layer 140-10, and a full-width dielectric layer 150-10 that are similar to those of spring structure 120-9. However, second dielectric portion 150-10B and third dielectric portion 150-10C extend all the way to tips 139-10B and 139-10B, and spring structure 120-10 further includes a (third) elongated conductive layer 170-10B that is formed on second dielectric portion 150-10B, and a fourth elongated conductive layer 170-10C formed on third dielectric portion 150-10C. Similar to tip portion 149-10, which is located over tip 139-10A in the manner described above, elongated conductive layer 170-10B includes a second tip portion 179-10B formed on dielectric portion 150-10B over the second tip 139-10B, and elongated conductive layer 170-10C includes a third tip portion 179-10C formed on dielectric portion 150-10C over the second tip 139-10B. Finally, to facilitate electrical connection between lower conductor 130-10 and conductive layers 170-10B and 170-10C, spring structure 120-10 includes a first metal via 172-B extending between layer portion 136-10B and conductive layer 170-10A through dielectric portion 150-10B, and a second metal via 172-C extending between the layer portion 136-10C and conductive layer 170-10B through dielectric portion 150-10C.

FIGS. 11(A) and 11(B) are top plan and cross-sectional side views showing a spring structure 120-11 according to a fourth three-tip embodiment of the present invention. Spring structure 120-11 includes a lower conductive layer 130-11, an upper conductive layer 140-11, and a full-width dielectric layer 150-11, a third conductive layer 170-11B, and a fourth conductive layer 170-10C that are essentially identical to those of spring structure 120-10. However, instead of using vias to connect lower conductive layer 130-11 to conductive layers 170-11B and 170-11C, spring structure utilizes a first metal side structure 175-B extending between layer portion 136-11B and conductive layer 170-11A along a side edge of dielectric portion 150-11B, and a second metal side structure 175-C extending between layer portion 136-11C and conductive layer 170-11B along a side of dielectric portion 150-10C.

Although the present invention has been described with respect to certain specific embodiments, it will be clear to those skilled in the art that the inventive features of the present invention are applicable to other embodiments as well, all of which are intended to fall within the scope of the present invention. For example, although the spring structures discussed above include pointed tips, one could also opt for flat tips depending on the contact pad material and geometry, and whether the spring is for a probe or for a permanent IC interconnect application. In addition, although metal-dielectric-metal structures are disclosed, the methods described herein can be used to generate sandwich structures having any number of metal and intervening dielectric layers.

The invention claimed is:

1. An assembly comprising:
a substrate including first and second contact pads;
an elongated coaxial spring finger having an anchor portion attached to the substrate, a curved cantilever portion extending from the anchor portion away from the substrate, and at least one tip located at a distal end of the cantilever portion,
wherein said coaxial spring finger includes:
a first elongated conductive layer having a first end connected to the first contact pad and a second end located adjacent to the at least one tip, wherein the first elongated conductive layer includes a first finger portion defining a first tip and a second finger portion defining a second tip;
a dielectric layer including a first dielectric portion extending along the first finger portion to the first tip; and
a second elongated conductive layer having a first end connected to the second contact pad and a second end located adjacent to the at least one tip, wherein the second elongated conductive layer is disposed on the dielectric layer over the first finger portion such that the first finger portion and the second conductive layer are separated by the first dielectric portion.

2. The assembly according to claim 1, wherein at least one of the first elongated conductive layer and the second elongated conductive layer comprises plated metal.

3. The assembly according to claim 1, wherein both the first elongated conductive layer and the second elongated conductive layer comprise spring metal.

4. The assembly according to claim 3, wherein at least one of the first elongated conductive layer and the second elongated conductive layer further comprises plated metal.

5. The assembly according to claim 1, wherein the dielectric layer comprises a stress-engineered dielectric material.

6. The assembly according to claim 5, wherein at least one of the first elongated conductive layer and the second elongated conductive layer comprise spring metal.

7. The assembly according to claim 5, wherein at least one of the first elongated conductive layer and the second elongated conductive layer comprises plated metal.

8. The assembly according to claim 1,
wherein the dielectric layer further comprises a second dielectric portion extending along the second finger portion,
wherein the second dielectric portion terminates adjacent to the second tip such that the second tip extends from an end of the second dielectric portion.

9. The assembly according to claim 1, wherein the first elongated conductive layer further comprises a third finger portion defining a third tip, the first finger portion being located between the second and third finger portions.

10. The assembly according to claim 9,
wherein the dielectric layer further comprises a second dielectric portion extending along the second finger portion, and a third dielectric portion extending along the third finger portion, and
wherein the second dielectric portion and the third dielectric portion terminate adjacent to the second tip and the third tip, respectively, such that the second tip and the third tip extend from ends of the second and third dielectric portions, respectively.

11. The assembly according to claim 10, further comprising:
a third elongated conductive layer formed on the second dielectric portion and having a second tip portion located over the second tip; and
a fourth elongated conductive layer formed on the third dielectric portion and having a third tip portion located over the second tip.

12. The assembly according to claim 11, wherein the spring finger further comprises:
a first metal via extending between the second finger portion and the third elongated conductive layer through the second dielectric portion; and
a second metal via extending between the third finger portion and the fourth elongated conductive layer through the third dielectric portion.

13. The assembly according to claim 11, wherein the spring finger further comprises:
a first metal side structure extending between the second finger portion and the third elongated conductive layer along a side of the second dielectric portion; and
a second metal side structure extending between the third finger portion and the fourth elongated conductive layer along a side of the third dielectric portion.

14. A coaxial spring structure comprises:
a first elongated conductive layer including an anchor portion, a first finger portion extending from the anchor portion to a first tip, and a second finger portion extending from the anchor portion to a second tip,
a dielectric layer formed on the first elongated conductive layer and extending along the first finger portion between the anchor portion and the first tip, and
a second elongated conductive layer [140—X] formed on the dielectric layer and extending over the first finger portion, wherein the second elongated conductive layer includes a tip portion located over the first tip.

15. The coaxial spring structure of claim 14,
wherein the first elongated conductive layer further comprises a third finger portion extending from the anchor portion to a third tip, and
wherein the first finger portion is located between the second finger portion and the third finger portion.

16. A coaxial spring structure comprises:
a first elongated conductive layer including an anchor portion, a first finger portion extending from the anchor portion to a first tip, a second finger portion extending from the anchor portion to a second tip, and a third finger portion extending from the anchor portion to a third tip, wherein the first finger portion is disposed between the second finger portion and the third finger portion;
a dielectric layer formed on the first elongated conductive layer and extending along the first finger portion between the anchor portion and the first tip; and
a second elongated conductive layer formed on the dielectric layer and extending over the first finger portion, wherein the second elongated conductive layer includes a tip portion located over the first tip.

* * * * *